(12) United States Patent
Joseph et al.

(10) Patent No.: US 6,645,848 B2
(45) Date of Patent: Nov. 11, 2003

(54) METHOD OF IMPROVING THE FABRICATION OF ETCHED SEMICONDUCTOR DEVICES

(75) Inventors: John R. Joseph, Morgan Hill, CA (US); Wenlin Luo, Alburquerque, NM (US); Kevin L. Lear, Ft. Collins, CO (US); Robert P. Bryan, Alburquerque, NM (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/872,747

(22) Filed: Jun. 1, 2001

(65) Prior Publication Data

US 2002/0182848 A1 Dec. 5, 2002

(51) Int. Cl.⁷ .......................................... H01L 21/4763
(52) U.S. Cl. ...................... 438/623; 438/628; 438/631; 438/644; 438/645
(58) Field of Search .............................. 438/39, 40, 42, 438/43, 46, 47, 38, 623, 628, 631, 644, 645

(56) References Cited

U.S. PATENT DOCUMENTS

| | | | |
|---|---|---|---|
| 4,377,438 A | 3/1983 | Moriya et al. | |
| 4,529,476 A | 7/1985 | Kawamoto et al. | |
| 4,612,805 A | 9/1986 | Bruce et al. | |
| 4,800,420 A | * 1/1989 | Chen et al. | 257/774 |
| 4,857,140 A | 8/1989 | Loewenstein | |
| 4,907,039 A | 3/1990 | Chikaki | |
| 4,978,419 A | 12/1990 | Nanda et al. | |
| 5,714,037 A | 2/1998 | Puntambekar et al. | |
| 5,756,402 A | 5/1998 | Jimbo et al. | |
| 5,834,329 A | * 11/1998 | Kim et al. | 438/40 |
| 5,869,219 A | 2/1999 | Kuo et al. | |
| 5,928,964 A | 7/1999 | Brankner | |
| 5,962,344 A | 10/1999 | Tu et al. | |
| 5,965,465 A | 10/1999 | Rath et al. | |
| 5,989,979 A | 11/1999 | Liu et al. | |
| 6,008,137 A | 12/1999 | Lee et al. | |
| 6,033,998 A | 3/2000 | Aronowitz et al. | |
| 6,037,269 A | 3/2000 | Kim et al. | |
| 6,051,504 A | 4/2000 | Armacost et al. | |
| 6,242,400 B1 | * 6/2001 | Lee | 510/176 |

* cited by examiner

Primary Examiner—Stephen D. Meier
Assistant Examiner—Khanh Duong
(74) Attorney, Agent, or Firm—White & Case LLP

(57) ABSTRACT

This invention relates to a method of improving the fabrication of etched semiconductor devices by using a patterned adhesion promoter layer over a hydrocarbon planarization material. More specifically, the present invention improves the bonding of a metal interconnect layer to a hydrocarbon planarization material, such as polyimide, by inserting an adhesion promotion layer, such as silicon nitride, between the hydrocarbon planarization material and the metal interconnect layer. A process for improving the fabrication of etched semiconductor devices, comprises the steps of: (1) depositing a hydrocarbon planarization material over a substrate; (2) depositing an adhesion promoter over the hydrocarbon planarization material; (3) defining a first mask and etching back the adhesion promoter so as to form an adhesion promoter pad over a portion of the hydrocarbon planarization material; and (4) depositing a first metal over the adhesion promoter pad.

16 Claims, 7 Drawing Sheets

METHOD OF IMPROVING THE FABRICATION OF ETCHED SEMICONDUCTOR DEVICES

FIELD OF THE INVENTION

This invention relates to a method of improving the fabrication of etched semiconductor devices by using a patterned adhesion promoter layer over a hydrocarbon planarization material. More specifically, the present invention improves the bonding of a metal interconnect layer to a hydrocarbon planarization material, such as polyimide, by inserting an adhesion promotion layer, such as silicon nitride, between the hydrocarbon planarization material and the metal interconnect layer.

BACKGROUND

During the fabrication of integrated circuit chips, various layers, such as insulating, metallizing and passivating layers, are deposited on the surface of a semiconductor substrate. These various layers should exhibit some degree of adhesion to one another. Poor adhesion between the layers may allow moisture or other impurities to penetrate the seams between the layers, causing corrosion or other impurity-induced phenomena that adversely impacts the performance of the integrated circuit. Similarly, poor adhesion between a metallizing layer and the underlying layer also may result in poor wire bonding because the deposited metal layer is not sufficiently bonded to the underlying layer. Accordingly, it is important that the bond between the deposited layer and the underlying layer be sufficiently strong so that the deposited layer does not separate from or flake off of the underlying layer.

During the fabrication of integrated circuit chips and oxide vertical cavity surface emitting lasers, various stages of dry or wet etching are performed to pattern and remove portions of the thin films that are deposited on the semiconductor substrate. During this process, a thin film is usually deposited over an etched surface to protect it. Typically, a hydrocarbon planarization material such as polyimide is used in this process. Polyimide is a well-known insulating material, and it is widely used as a passivation film or an inter-level insulating film between upper and lower wiring layers. A polyimide film can be formed on a semiconductor substrate through a spin-coating method and subsequently cured or hardened in a high temperature heat-treatment process. After the polyimide film is cured, a metal interconnect layer is often deposited and patterned on the surface of the polyimide film. A wire bond may be attached to the surface of the metal interconnect layer, and the wire bond functions to electrically connect the semiconductor device to the external environment. However, poor bonding often results between the metal interconnect layer and the polyimide layer because the polyimide layer does not provide a robust bonding surface for the metal interconnect layer. Poor adhesion of the interconnect metal to the polyimide layer typically creates a wire bonding problem, which is the inability to reliably and robustly connect a wire bond to the thin metal interconnect layer. A high failure rate of wire bonds can adversely effect the performance of the semiconductor device.

Various techniques have been attempted in an effort to improve the bonding between the metal interconnect layer and a hydrocarbon planarization material such as polyimide. These techniques include: (1) roughening the surface of the hydrocarbon planarization material to provide a better adhesion surface; (2) de-scumming the surface of the hydrocarbon planarization material in an effort to improve adhesion; and (3) varying the curing time and temperature bake of the hydrocarbon planarization material. However, none of these methods have produced a reliable means to improve the adhesion between the metal interconnect layer and the hydrocarbon planarization layer.

Accordingly, there exists a need in the art of semiconductor fabrication to provide a method to improve the adhesion between a metal interconnect layer and a hydrocarbon planarization material such as polyimide.

SUMMARY

In view of the above-stated disadvantages of the prior art, it is an object of the present invention to provide a method for improving the adhesion of a metal interconnect layer to a hydrocarbon planarization material such as polyimide.

It is another object of the present invention to provide a fabrication process that is compatible with the planarization process that is used in a typical semiconductor manufacturing process.

It is another object of the present invention to improve the wire bonding strength of a metal interconnect layer.

It is another object of the present invention to improve the reliability and robustness of a semiconductor device by improving the bonding between a metal interconnect layer and a polyimide layer.

These and other objects are achieved by the present invention which is a method for improving the fabrication of etched semiconductor devices. The method includes the steps of depositing a hydrocarbon planarization material over a substrate; depositing an adhesion promoter over the hydrocarbon planarization material; patterning the adhesion promoter so as to form an adhesion promoter pad over a portion of the hydrocarbon planarization material; and deposition a first metal over the adhesion promoter pad.

These steps describe a process, according to an embodiment of the invention, for improving the adhesion of a metal interconnect layer to a hydrocarbon planarization material such as polyimide is described below. This process may be suitable in the fabrication of various semiconductor devices, including vertical cavity surface emitting lasers.

Moreover, although an embodiment of the invention utilizes silicon nitride as an adhesion promotion layer between the metal interconnect layer and polyimide layer, other substances also may be used in place of silicon nitride. For example, silicon oxide may be used in place of silicon nitride throughout the entire process steps. Silicon oxide has similar characteristics as silicon nitride and functions as a robust adhesion promotion layer between the metal interconnect layer and the polyimide layer. Furthermore, although an embodiment of the invention utilizes polyimide as the hydrocarbon planarization material, other hydrocarbon planarization material that have similar characteristics may be used.

DRAWINGS

The accompanying drawings, which are incorporated and constitute a part of the specification, illustrate embodiments of the invention. These drawings, together with the above-stated general description and the following detailed description, serve to explain the principles of the invention.

Figure 7:
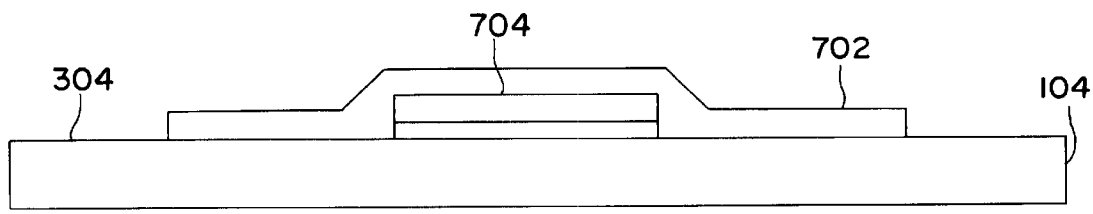

FIG. 7. is a cross-sectional diagram showing a second layer silicon nitride deposited over a second surface of the substrate and over a first surface of the first layer of silicon nitride.

Figure 8:
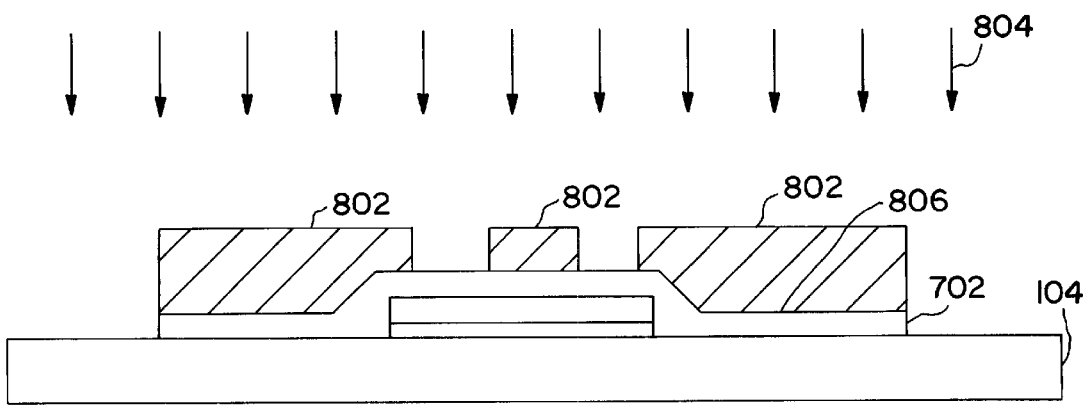

FIG. 8 is a schematic cross-sectional diagram showing a patterned photoresist layer that is formed on a first surface of the second layer of silicon nitride, according to an embodiment of the invention.

Figure 9:
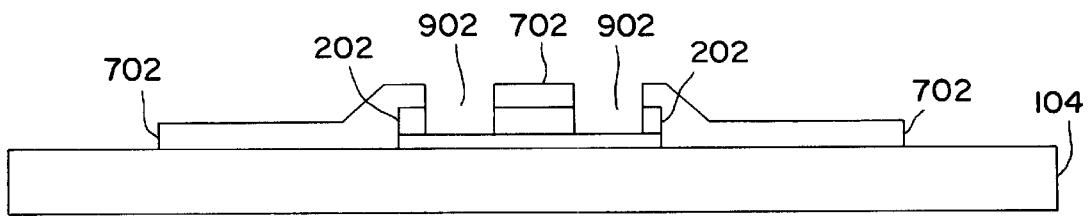

FIG. 9 is a schematic cross-sectional diagram showing a P-element contact pad etched into the first and second layers of silicon nitride, according to an embodiment of the invention.

Figure 10:
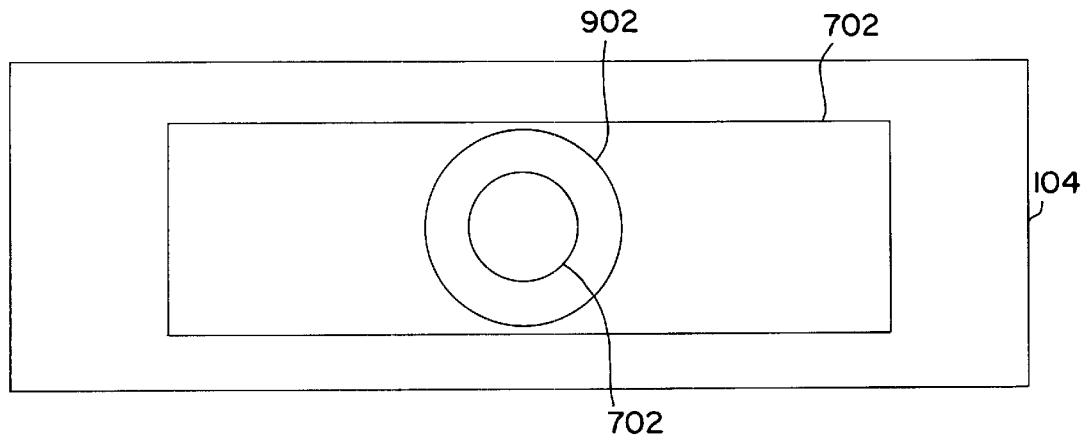

FIG. 10 is a schematic top-down-view diagram showing the P-element contact pad etched into the first and second layers of silicon nitride, according to an embodiment of the invention.

Figure 11:
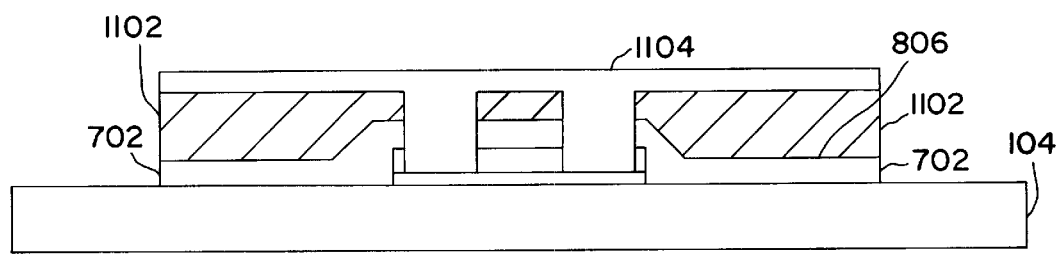

FIG. 11 is a schematic cross-sectional diagram showing a layer of photoresist deposited on a first surface of the second layer of silicon nitride and showing a metal contact deposited in the P-element contact pad, according to an embodiment of the invention.

Figure 12:
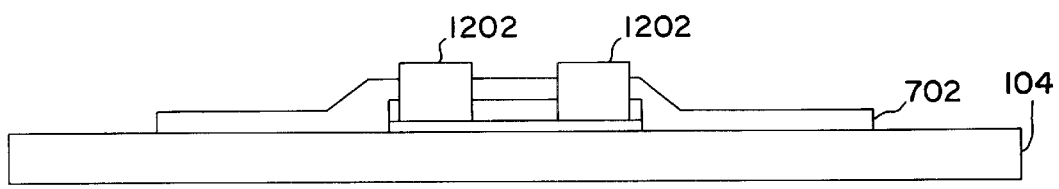

FIG. 12 is a schematic cross-sectional diagram showing a metal contact deposited in the P-element contact pad, according to an embodiment of the invention.

Figure 13:
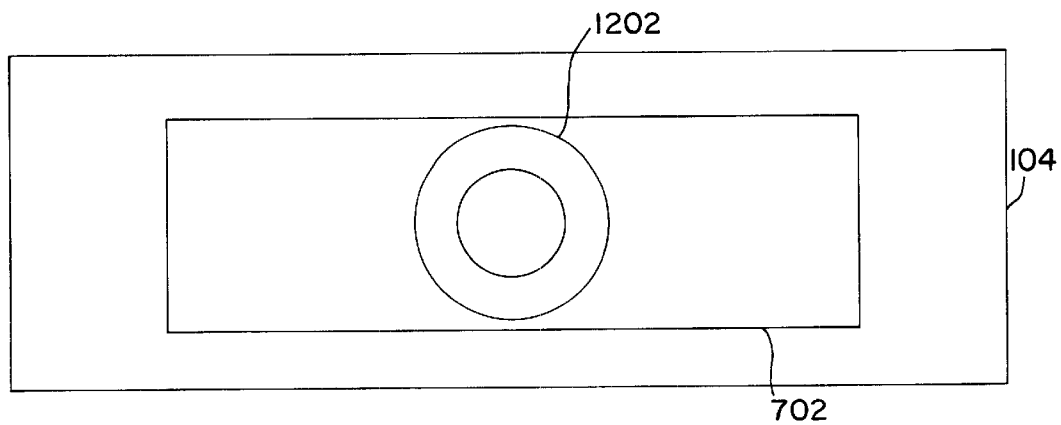

FIG. 13 is a schematic top-down view showing the metal contact and the first surface of the second layer of silicon nitride, according to an embodiment of the invention.

Figure 14:
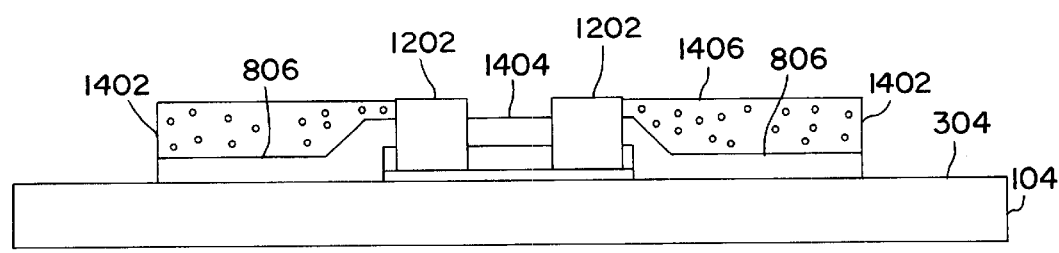

FIG. 14 is a schematic cross-sectional diagram showing a polyimide layer deposited on a portion of the first surface of the second layer of silicon nitride, according to an embodiment of the invention.

Figure 15:
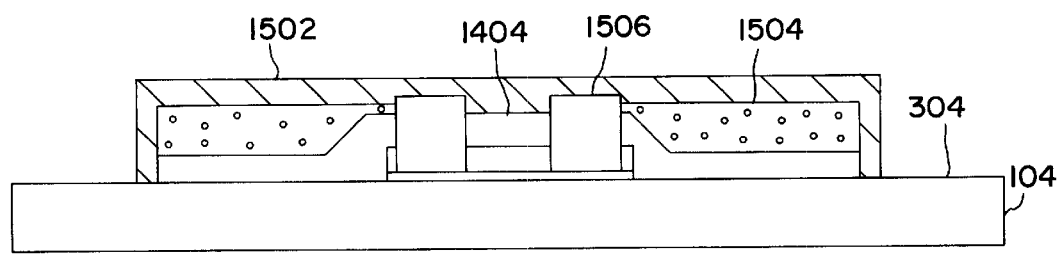

FIG. 15 is a schematic cross-sectional diagram showing a third layer of silicon nitride deposited on the following areas: (1) the second surface of the substrate; (2) the first surface of the polyimide; (3) the first surface of the metal contact; and (4) the first surface of the second layer of silicon nitride that is exposed in a region between the metal contact.

Figure 16:
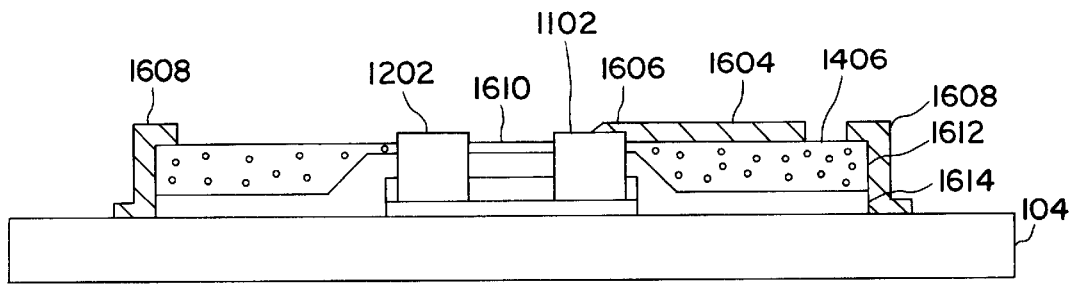

FIG. 16 is a schematic cross-sectional diagram showing a patterned third layer of silicon nitride, according to an embodiment of the invention.

Figure 17:
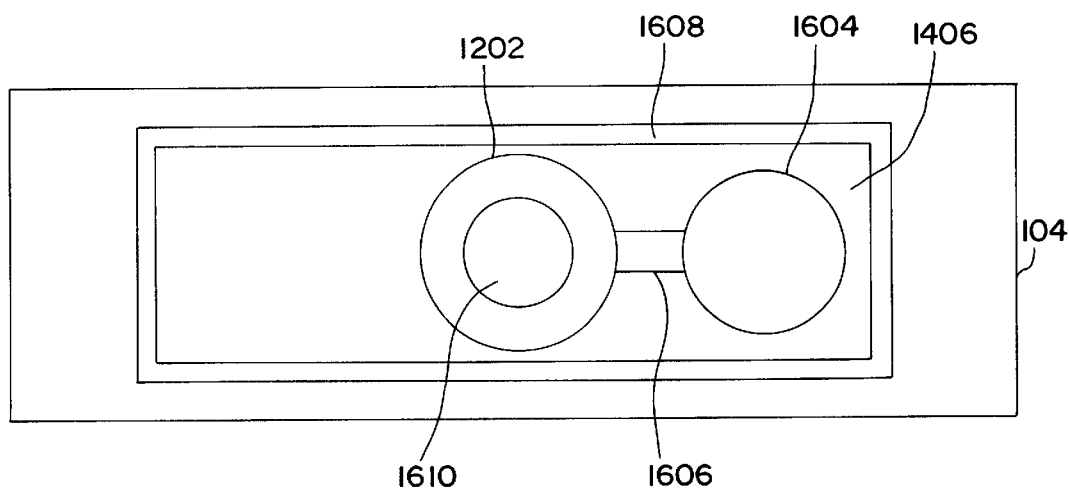

FIG. 17 is a schematic top-down view showing a patterned third layer of silicon nitride, according to an embodiment of the invention.

Figure 18:
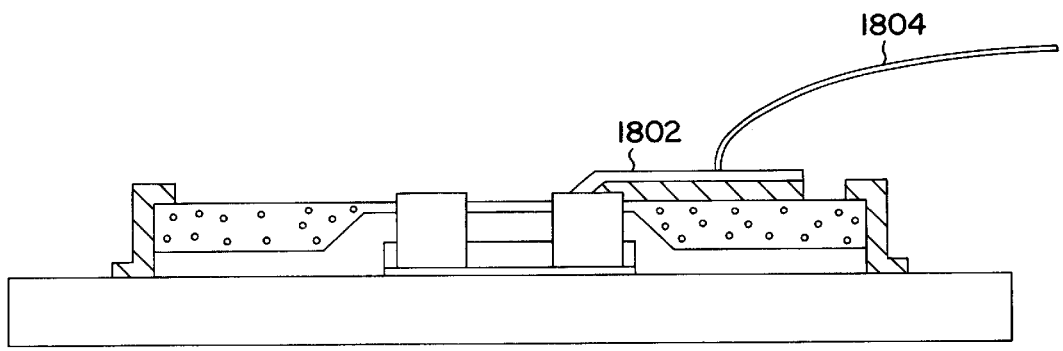

FIG. 18 is a schematic cross-sectional diagram showing a metal interconnect layer that is deposited on a silicon nitride pad and a silicon nitride neck, according to an embodiment of the invention.

Figure 19:
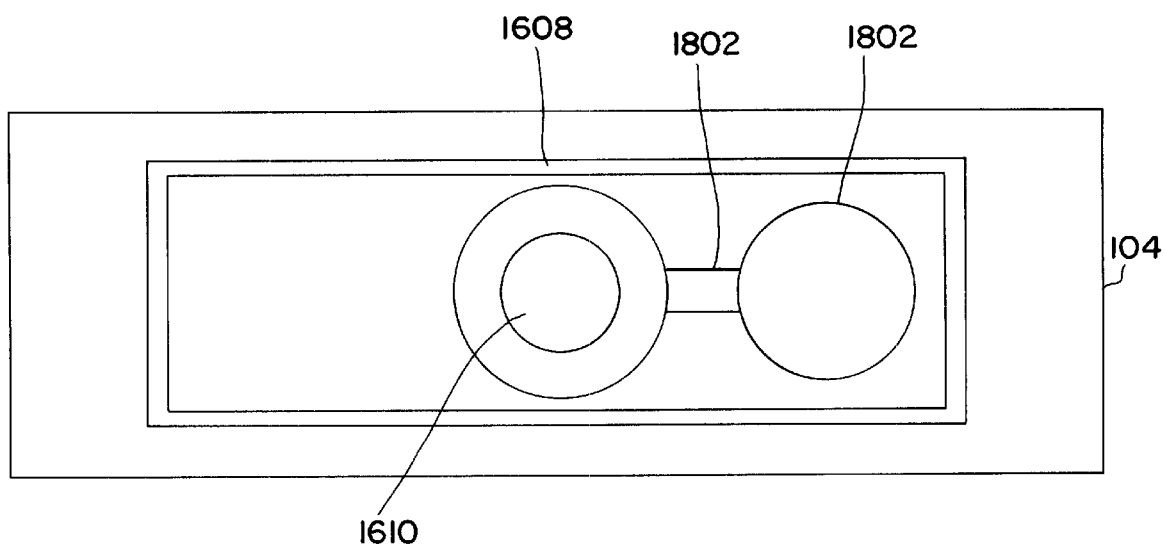

FIG. 19 is a top-down view showing a metal interconnect layer deposited on the silicon nitride pad and the silicon nitride neck, according to an embodiment of the invention.

DESCRIPTION

I. Introduction

The present invention is described below. However, those skilled in the art will recognize that the disclosed methods are adaptable for broader applications. Moreover, if the same reference numeral is repeated with respect to different figures, it refers to the corresponding structure in each figure.

A process, according to an embodiment of the invention, for improving the adhesion of a metal interconnect layer to a hydrocarbon planarization material such as polyimide is described below. This process is described by referring to FIGS. 1–19. These figures are a series of schematic diagrams illustrating the results of progressive stages in forming an embodiment of the invention.

A. Process Steps

A process, according to an embodiment of the invention, for improving the adhesion of a metal interconnect layer to a hydrocarbon planarization material comprises the following steps:

1. Depositing a first layer of silicon nitride;
2. Defining a mask and patterning and etching the first layer of silicon nitride;
3. Semiconductor etch;
4. Oxidizing the mesa;
5. Depositing a second layer of silicon nitride;
6. Defining a silicon nitride mask and patterning the second layer of silicon nitride;
7. Depositing a metal contact;
8. Depositing a polyimide layer;
9. Depositing a third layer of silicon nitride
10. Defining a silicon nitride mask and patterning the third layer of silicon nitride; and
11. Depositing a metal interconnect layer.

These process steps are described in detail below.

1. Depositing a First Layer of Silicon Nitride

Figure 1:
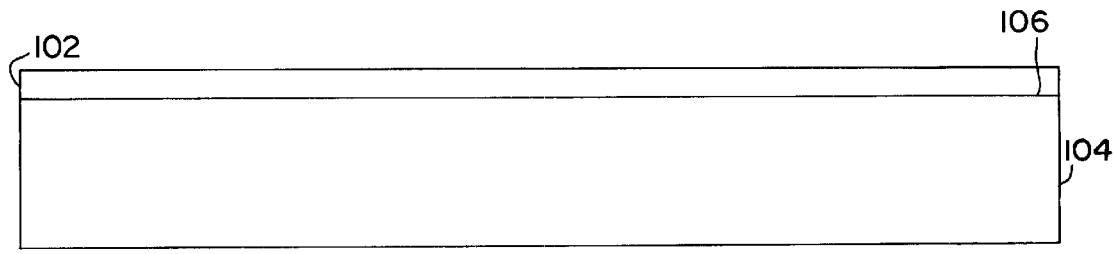
FIG. 1 is a schematic cross-sectional diagram showing a first layer of silicon nitride deposited on a first surface of a substrate, according to an embodiment of the invention.

The first step in the process is to deposit a first layer of silicon nitride ($Si_3N_4$) 102 on a first surface of a substrate 106. FIG. 1 shows a schematic cross-sectional diagram of the first layer of silicon nitride 102 deposited on the first surface of a substrate 106, according to an embodiment of the invention. In place of silicon nitride, silicon dioxide, oxy-nitride or other compounds with similar characteristics may be used. The substrate 104 may be comprised of gallium arsenide (GaAs) or any other suitable substrate that is commonly used in the fabrication of semiconductor devices. The substrate also may comprise any number of semiconductor layers that are well known in the art.

The first layer of silicon nitride 102 may be deposited on the substrate 104 by a chemical-vapor deposition process or any other standard technique for depositing a passivation layer.

The first layer of silicon nitride 102 serves as an insulating and passivation layer to prevent contamination of the substrate 104 by, for example, light ions such as sodium that would otherwise degrade the electrical properties of the underlying semiconductor device. The first layer of silicon nitride 102 acts as a protective barrier for a lens of a vertical cavity surface emitting laser.

Figure 2:
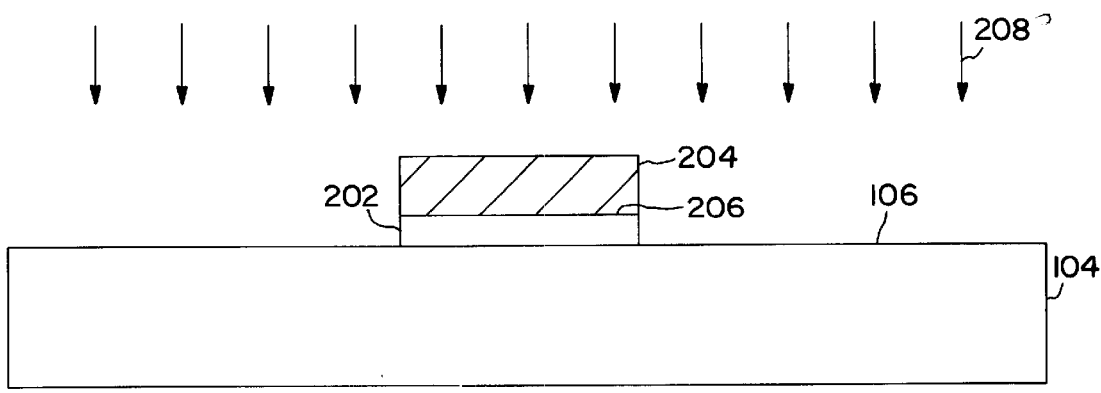
FIG. 2 is a schematic cross-sectional diagram showing a photoresist mask that is formed on a first surface of the first layer of silicon nitride and an etching process, according to an embodiment of the invention.

2. Defining a Mask and Patterning and Etching the First Layer of Silicon Nitride Once the first layer of silicon nitride 102 is deposited over the first surface of the silicon substrate 106, the next step in the process is to pattern or etch the silicon nitride 102 to create a thin region of silicon nitride 202 on a portion of the first surface of the substrate 106. Specifically, as shown in FIG. 2 according to an embodiment of the invention, a photoresist layer 204 is defined on a portion of a first surface of the first layer of silicon nitride 206 by using any standard photolithographic technique. After the photoresist mask 204 is defined, the exposed area of the first layer of silicon nitride is stripped or etched away using a standard etching process. The arrows 208 shown in FIG. 2 depict the etching process according to an embodiment of the invention. The etch is performed until the silicon nitride in the exposed areas is removed, as shown in FIG. 2, which is an embodiment of the invention. For example, if the substrate 104 is comprised of gallium arsenide, the first layer of silicon nitride 102 is etched away so that the underlying layer of gallium arsenide is exposed. As a result of the etching process, a thin region of silicon nitride 202 is patterned on a portion of the first surface of the substrate 106, as shown in FIG. 2, which is an embodiment of the invention.

3. Semiconductor Etch

Figure 3:
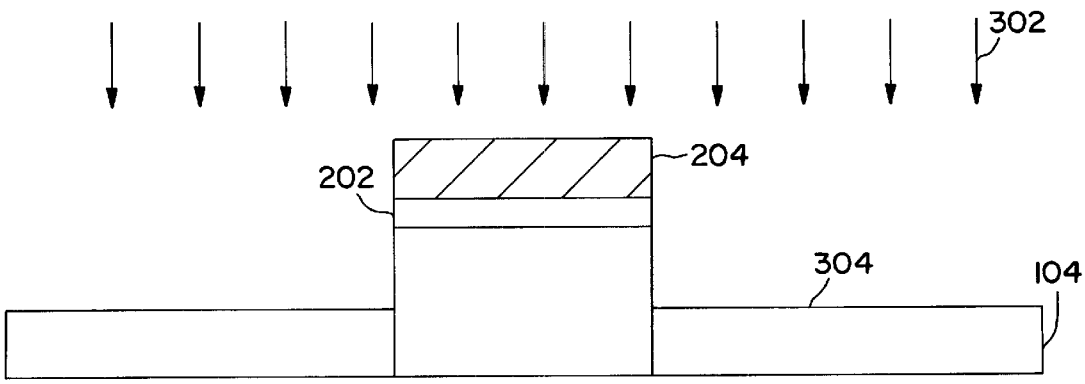
FIG. 3 is a schematic cross-sectional diagram showing the etching of the substrate, according to an embodiment of the invention.

Once the thin region of silicon nitride 202 is formed on the first surface of the substrate 106, the next step is to etch away or pattern the substrate 104 so as to create a mesa. Specifically, a portion of the exposed area of the substrate surrounding the thin region of silicon nitride 202 is etched away, as shown in FIG. 3, which is an embodiment of the invention. This etching process is performed by using any standard etching process and the photoresist mask 204 that remains on the first layer of silicon nitride, as shown in FIG. 3. The arrows 302 shown in FIG. 3 depict the etching process according to an embodiment of the invention. The etching process is performed until a second surface of the substrate 304 is exposed.

Figure 4:
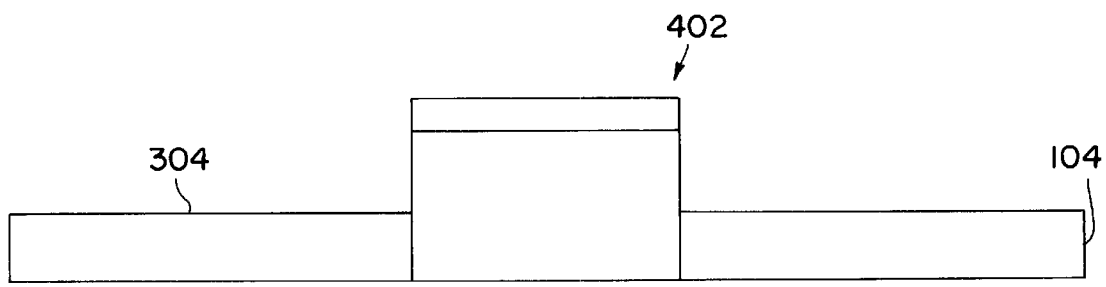
FIG. 4 is a schematic cross-sectional diagram showing a mesa that is primarily comprised of substrate, according to an embodiment of the invention.
Figure 5:
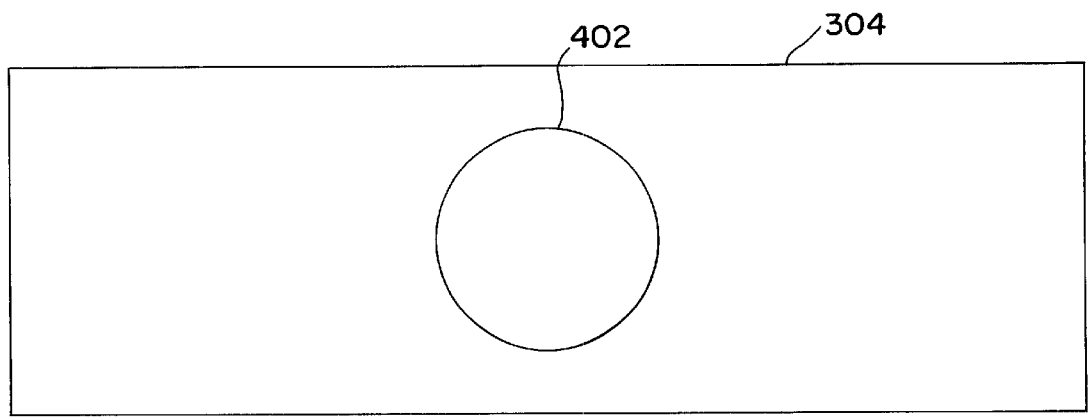
FIG. 5 is a schematic top-down-view diagram showing the mesa formed on the substrate, according to an embodiment of the invention.

After the etching process is completed, the photoresist mask 204 is removed or stripped away using any standard cleaning process. FIG. 4 is a schematic side-view diagram of an embodiment of the invention after the photoresist mask is stripped away. FIG. 4 shows the mesa 402 that is formed on the substrate 104. The mesa 402 is elevated above the second surface of the substrate 304, as shown in FIG. 4. The mesa 402 forms the beginnings of a vertical cavity surface emitting laser. FIG. 5 is a schematic top-down-view diagram showing the mesa 402 that is formed on the second surface of the substrate 304, according to an embodiment of the invention.

4. Oxidizing the Mesa

Figure 6:
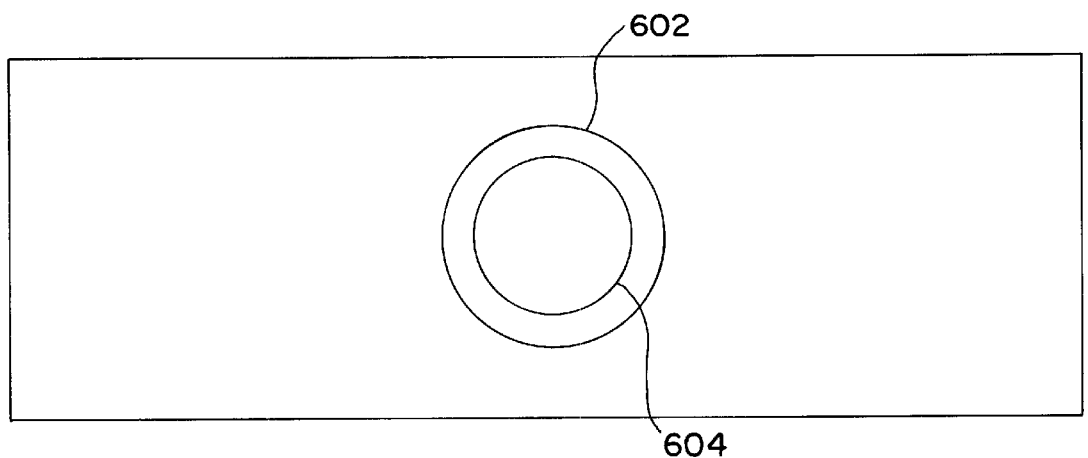
FIG. 6 is a schematic top-down view showing an oxidized collar that encircles a base of the mesa, according to an embodiment of the invention.

After the mesa is formed, the next step is to oxidize a portion of the substrate surrounding the base of the mesa. This oxidation step is performed by any standard oxidation process that is well-known in the art. The oxidation step produces a collar of oxidized material 602 surrounding the base of the mesa 604. This oxidized collar 602 that encircles the base of the mesa 604 is shown in FIG. 6, which is a top-down view of an embodiment of the invention. The purpose of the oxidation step is to confine electrical current in the center region of the mesa and to aid in defining an aperture for a vertical cavity surface emitting laser.

5. Depositing a Second Layer of Silicon Nitride

After the oxidation step, the next step is to deposit a second layer of silicon nitride 702. This second layer of silicon nitride 702 is deposited over the second surface of the substrate 304, as shown in FIG. 7, which is an embodiment of the invention. The second layer of silicon nitride 702 is also deposited over the first surface of the first layer of silicon nitride 704, as shown in FIG. 7, according to an embodiment of the invention.

The second layer of silicon nitride 702 serves as an insulating and passivation layer to prevent contamination of the substrate by, for example, light ions such as sodium that would otherwise degrade the electrical properties of the underlying semiconductor device. The second layer of silicon nitride 702 also functions as a bonding surface for a polyimide layer, as explained below. The second layer of silicon nitride 702 may be deposited by a chemical-vapor deposition process or any other standard deposition process.

6. Defining a Silicon Nitride Mask and Patterning the Second Layer of Silicon Nitride After the second layer of silicon nitride 702 is deposited, the next step is to define a mask and pattern the second layer of silicon nitride 702. Specifically, a positive photoresist layer 802 is defined on a first surface of the second layer of silicon nitride 806, as shown in FIG. 8 according to an embodiment of the invention. Then, the second layer of silicon nitride 702 is etched (i.e., patterned) using any standard etching process. The arrows 804 shown in FIG. 8 depict this etching process according to an embodiment of the invention. This etching process is performed until the first layer of silicon nitride 202 and the second layer of silicon nitride 702 are removed in the open area of the photoresist mask 802.

After the etching process is completed, the photoresist mask 802 is removed or stripped away using any standard cleaning process. FIG. 9 is a schematic cross-sectional diagram showing an embodiment of the invention after the photoresist mask 802 is removed, according to an embodiment of the invention.

By removing the two layers of silicon nitride in the open area of the photoresist mask 802, a cavity or open region is formed in the first layer of silicon nitride 202 and also in the second layer of silicon nitride 702, according to an embodiment of the invention as shown in FIG. 9. This open region forms a P-element contact pad 902 as shown in FIG. 9.

FIG. 10 is a schematic top-down-view diagram showing the P-element contact pad 902 etched into the first and second layers of silicon nitride, according to an embodiment of the invention. FIG. 10 also shows the second layer of silicon nitride 702 that is deposited on the substrate 104, according to an embodiment of the invention. FIG. 10 depicts the second layer of silicon nitride 702 surrounding the P-element contact pad 902, according to an embodiment of the invention.

7. Depositing a Metal Contact

At this point, a P-element contact pad 902 is formed in the first and second layers of silicon nitride as shown in FIG. 9, and next step is to deposit a metal contact 1104 in the P-element contact pad 902. Specifically, a second photoresist 1102 is defined on the first surface of the second layer of silicon nitride 806, except for an opening for the P-element contact pad 902. A positive photoresist is used in this process. Once the second photoresist 1102 is defined, a metal contact 1104 is deposited in the opening of the second photo-resist 1102 in such a manner that the metal contact 1104 is deposited into the P-element contact pad 902, as shown in FIG. 11 according to an embodiment of the invention.

The second photoresist 1102 is cleaned off or washed away using standard lithography techniques and any excess metal contact 1104 evaporated. This leaves the metal contact 1104 deposited in the P-element contact pad 902. FIG. 12 is a schematic cross-sectional diagram showing the metal contact 1202 formed in the P-element contact pad 902, according to an embodiment of the invention. FIG. 13 is a schematic top-down view showing the metal contact 1202 surrounded by the second layer of silicon nitride 702, according to an embodiment of the invention.

8. Depositing a Polyimide Layer

After the metal contact 1202 has been formed, the next step is to deposit a layer of a hydrocarbon planarization material such as polyimide 1402. The hydrocarbon planarization material or polyimide 1402, is deposited and defined on a portion of the first surface of the second layer of silicon nitride 806 using standard deposition and defining techniques. FIG. 14 is a schematic cross-sectional diagram showing the polyimide layer 1402 deposited on a portion of the first surface of the second layer of silicon nitride 806, according to an embodiment of the invention. No polyimide 1402 is present on the first surface of the second layer of silicon nitride that is exposed in the region between the metal contact 1404, as shown in FIG. 14. Likewise, no polyimide is present on the second surface of the substrate 304, as shown in FIG. 14 according to an embodiment of the invention.

Once the polyimide 1402 has been defined, the polyimide 1402 is cured or hardened in any standard high temperature heat-treatment process, which is well-known in the art.

The polyimide layer 1402 functions, in part, to planarize the surface of the second layer of silicon nitride 806, and it also improves the speed of the semiconductor device. The polyimide layer 1402 also acts as an insulating layer.

9. Depositing a Third Layer of Silicon Nitride

At this point, the layer of polyimide 1402 is deposited on a portion of the first surface of the second layer of the silicon nitride 806, as shown in FIG. 14 according to an embodiment of the invention. The next step is to deposit and pattern a third layer of silicon nitride 1502. As shown in FIG. 15, the third layer of silicon nitride 1502 is deposited on the following areas: (1) the first surface of the substrate 304; (2) the first surface of the polyimide 1504; (3) the first surface of the metal contact 1506; and (4) the first surface of the second layer of silicon nitride that is exposed in the region between the metal contact 1404, according to an embodiment of the invention. The third layer of silicon nitride 1052 is deposited in these four regions using standard lithography techniques. The third layer of silicon nitride 1502 may be deposited by a chemical-vapor deposition process or any other standard deposition process. The third layer of silicon nitride 1502 functions as an bonding surface for a metal interconnect layer 1802, as explained below.

10. Defining a Silicon Nitride Mask and Patterning the Third Layer of Silicon Nitride Once the third layer of silicon nitride 1502 is deposited, the next step is to etch or pattern the third layer of silicon nitride 1502 into discrete regions. These regions are as follows: (1) a silicon nitride pad; (2) a silicon nitride neck; (3) a silicon nitride aperture; and (4) a silicon nitride seal. The patterning of the third layer of silicon nitride into these discrete regions is described below.

Silicon Nitride Pad and Neck

A silicon nitride mask is defined over the first surface of the polyimide 1406, and the third layer of silicon nitride 1502 is then etched back or patterned to form a silicon nitride pad 1604 over a portion of the first surface of the polyimide 1406. FIG. 16 is a schematic cross-sectional diagram showing the silicon nitride pad 1604 that is defined on a portion of the first surface of the polyimide 1406, according to an embodiment of the invention. Similarly, FIG. 17 is a schematic top-down view showing the silicon nitride pad 1604 that is defined on a portion of the first surface of the polyimide 1406, according to an embodiment of the invention. The silicon nitride pad 1604 is formed approximately in the center of the first surface of the polyimide 1406, as shown in FIG. 17. The silicon nitride pad 1604 functions as a bonding surface for the metal interconnect layer 1802, as explained below.

The third layer of silicon nitride 1502 is additionally etched back or patterned to form the silicon nitride neck 1606, as shown in FIGS. 16 and 17 according to an embodiment of the invention. The silicon nitride neck 1606 connects the silicon nitride pad 1604 to the metal contact 1202, as shown in FIG. 17. In other words, the silicon nitride neck 1606 extends one end of the silicon nitride neck 1604 to one end of the metal contact 1202, as shown in FIGS. 16 and 17, according to an embodiment of the invention.

A purpose of patterning the third layer of silicon nitride 1502 to form the silicon nitride pad 1604 and silicon nitride neck 1606 is to provide a robust bonding surface for the metal interconnect layer 1802. Specifically, depositing the metal interconnect layer 1802 on the first surface of the polyimide layer 1406 may create poor bonding between the metal interconnect layer 1802 and polyimide layer 1402. This may lead to wire bonding or other problems. To eliminate these issues, the third layer of silicon nitride 1502 is deposited on the first surface of the polyimide layer 1406. However, the third layer of silicon nitride 1502 is somewhat brittle, and the underlying layer of polyimide 1402 is relatively soft and flexible. These and other factors may cause the third layer of silicon nitride 1502 to crack or separate from the polyimide layer 1402, creating a poor and unstable bonding surface for the metal interconnect layer 1802. This in turn may cause breaks in the metal interconnect layer 1802, which is eventually deposited over the third layer of silicon nitride 1502. Accordingly, the third layer of silicon nitride 1502 is patterned so as to create small surface areas of silicon nitride on the first surface of the polyimide layer 1406. These small areas are the silicon nitride pad 1604 and the silicon nitride neck 1606, as shown in FIGS. 16 and 17 according to an embodiment of the invention. The metal interconnect layer 1802 is then deposited over these small areas of silicon nitride, as described below. Consequently, by patterning the third layer silicon nitride 1502, the surface tension or stress of the silicon nitride 1502 is reduced. This creates a reliable, stable and robust bonding surface for the metal interconnect layer 1802.

Silicon Nitride Aperture

The third layer of silicon nitride 1502 is also etched back or patterned so that a third layer of silicon nitride lies in an aperture region 1610, which is that region between the metal contact 1202, as shown in FIGS. 16 and 17 according to an embodiment of the invention. The purpose of patterning the third layer of silicon nitride in the aperture region is so that the silicon nitride acts as an anti-reflective coating layer along with the first and second layers of silicon nitride.

Silicon Nitride Seal

Finally, the third layer of silicon nitride 1502 is additionally patterned and etched to create a silicon nitride seal 1608 over the first surface of the polyimide 1406, as shown in FIGS. 16 and 17 according to an embodiment of the invention. The silicon nitride seal 1608 extends from the first surface of the polyimide 1406 to the second surface of the substrate 304. The silicon nitride seal 1608 passes along an edge of the polyimide 1612 and along an edge of the second layer of silicon nitride 1614, as shown in FIG. 16. Similarly, FIG. 17 is a top-down view showing the silicon nitride seal 1608 surrounding the layer of polyimide 1402, according to an embodiment of the invention. The purpose of the silicon nitride seal 1608 is to seal the polyimide 1402 and prevent it from separating or flaking off from the underlying layer of silicon nitride 702. The silicon nitride seal 1608 also prevents moisture or other impurities from penetrating the seams of the layers, causing corrosion or other impurity-induced phenomena that may adversely affect the performance of the semiconductor device.

Once the silicon nitride seal 1608, silicon nitride pad 1604, silicon nitride neck 1606 and silicon nitride aperture 1610 are formed, the silicon nitride mask is cleaned off or washed away using standard etching techniques.

11. Depositing a Metal Interconnect Layer

After the third layer of silicon nitride 1502 is patterned, the final step is to deposit the thin metal interconnect layer 1802 on the silicon nitride pad 1604 and silicon nitride neck 1606. The metal interconnect layer 1802 is deposited and patterned on these areas by using standard metal deposition and liftoff or etchback procedures.

FIG. 18 is a schematic cross-sectional diagram showing the metal interconnect layer 1802 deposited on the silicon nitride pad 1604 and silicon nitride neck 1606, according to an embodiment of the invention. FIG. 19 is a top-down view showing the metal 1802 deposited over the silicon nitride pad 1604 and silicon nitride neck 1606, according to an embodiment of the invention.

The metal interconnect layer 1802 functions to electrically connect the semiconductor device to an external environment. A wire bond may be adapted on a first surface of metal interconnect layer 1804, as shown in FIG. 18.

B. Conclusion

While we have described our preferred embodiments of the present invention, it is understood that those skilled in the art, both now and in the future, may make various improvements and enhancements that fall within the scope of the claims that follow. These claims should be construed to maintain the proper protection for the invention first disclosed.

What is claimed:

1. A process for improving the fabrication of etched semiconductor devices, comprising the steps of:
   a) depositing a first layer of an adhesion promoter over a substrate and patterning the adhesion promoter to form a mesa of adhesion promoter over the substrate;
   b) depositing a hydrocarbon planarization material over the substrate and over the mesa formed on the substrate;
   c) defining the hydrocarbon planarization material so that at least a portion of a first surface of the mesa is exposed;
   d) depositing a second layer of adhesion promoter over the hydrocarbon planarization material;
   e) defining a first mask and etching back the second layer of adhesion promoter so as to form an adhesion promoter pad and an adhesion promoter neck over a portion of the hydrocarbon planarization material; and
   f) depositing a first metal over the adhesion promoter pad and over the adhesion promoter neck.

2. A process according to claim 1, wherein the adhesion promoter neck extends from one end of the adhesion promoter pad to a contact pad on the first surface of the exposed mesa.

3. A process according to claim 1, further comprising the steps of:
   a) defining a second mask and etching back a first surface of the exposed mesa to form the contact pad; and
   b) depositing a second metal in the contact pad, where the second metal is in contact with the first metal.

4. A process according to claim 1, wherein the contact pad is a P-element contact pad.

5. A process for improving the fabrication of etched semiconductor devices, comprising the steps of:
   a) depositing a hydrocarbon planarization material over a substrate;
   b) depositing an adhesion promoter over the hydrocarbon planarization material; and
   c) patterning the adhesion promoter so as to form an adhesion promoter seal, the seal extending from a first surface of the hydrocarbon planarization material to a first surface of the substrate, the seal passing along an edge of the adhesion promoter and an edge of the hydrocarbon planarization material.

6. A process according to claim 5, wherein the adhesion promoter is silicon oxide.

7. A process according to claim 5, wherein the adhesion promoter is silicon nitride.

8. A process according to claim 5, wherein the hydrocarbon planarization material is polyimide.

9. A process for improving the fabrication of etched semiconductor devices, comprising the steps of:
   a) depositing a first layer of an adhesion promoter over a substrate and patterning the adhesion promoter to form a first mesa of adhesion promoter over the substrate;
   b) depositing a second layer of adhesion promoter over the first mesa and over the substrate, the second layer of adhesion promoter forming a second mesa;
   c) depositing a hydrocarbon planarization material over the second layer of adhesion promoter and defining the hydrocarbon planarization material so that at least a portion of a first surface of the second mesa is exposed;
   d) depositing a third layer of adhesion promoter over the hydrocarbon planarization material, over the second mesa and over the substrate;
   e) defining a first mask and etching back the third layer of adhesion promoter so as to form an adhesion promoter pad over a portion of the hydrocarbon planarization material; and
   f) depositing a first metal over the adhesion promoter pad.

10. A process according to claim 9, wherein the adhesion promoter is silicon oxide.

11. A process according to claim 9, wherein the adhesion promoter is silicon nitride.

12. A process according to claim 9, wherein the hydrocarbon planarization material is Polyimide.

13. A process according to claim 9, further comprising the steps of:
   a) further defining the mask and etching back the third layer of adhesion promoter so as to form an adhesion promoter neck over a portion of the hydrocarbon planarization material, the neck extending from one end of the adhesion promoter pad to a contact pad on the first surface of the second mesa; and
   b) depositing the first metal over the adhesion promoter neck, the first metal extending from over the adhesion promoter pad, to over the adhesion promoter neck and to the contact pad on the second mesa.

14. A process according to claim 9, further comprising the steps of:
   a) defining a second mask and etching back the first surface of the second mesa to form the contact pad; and
   b) depositing a second metal in the contact pad, where the second metal is in contact with the first metal.

15. A process according to claim 14, wherein the contact pad is a P-element contact pad.

16. A process according to claim 9, wherein the hydrocarbon planarization material is polyimide.

* * * * *